(12) United States Patent
Choi et al.

(10) Patent No.: US 12,336,098 B2
(45) Date of Patent: Jun. 17, 2025

(54) PRINTED CIRCUIT BOARD

(71) Applicant: SAMSUNG ELECTRO-MECHANICS CO., LTD., Suwon-si (KR)

(72) Inventors: Jae Woong Choi, Suwon-si (KR); Jae Ho Shin, Suwon-si (KR); Joo Hwan Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 564 days.

(21) Appl. No.: 17/692,560

(22) Filed: Mar. 11, 2022

(65) Prior Publication Data

US 2023/0171890 A1 Jun. 1, 2023

(30) Foreign Application Priority Data

Dec. 1, 2021 (KR) .......................... 10-2021-0170043

(51) Int. Cl.
| | |
|---|---|
| *H05K 1/11* | (2006.01) |
| *H01L 23/12* | (2006.01) |
| *H01L 23/538* | (2006.01) |
| *H01L 25/065* | (2023.01) |
| *H01L 25/10* | (2006.01) |
| *H05K 1/18* | (2006.01) |

(52) U.S. Cl.
CPC .............. *H05K 1/115* (2013.01); *H01L 23/12* (2013.01); *H01L 23/5381* (2013.01); *H01L 23/5384* (2013.01); *H01L 23/5386* (2013.01); *H01L 25/0657* (2013.01); *H01L 25/105* (2013.01); *H05K 1/186* (2013.01)

(58) Field of Classification Search
CPC .............. H01L 25/105; H01L 23/5383; H01L 23/5385; H01L 23/5389; H01L 24/16; H01L 25/18; H05K 1/185
See application file for complete search history.

(56) References Cited

U.S. PATENT DOCUMENTS

| | | | |
|---|---|---|---|
| 10,068,852 B2 | 9/2018 | Mahajan et al. | |
| 10,629,469 B2 | 4/2020 | Konchady et al. | |
| 2020/0161279 A1* | 5/2020 | Mok | H01L 23/28 |
| 2020/0163214 A1* | 5/2020 | Terauchi | H05K 1/185 |

\* cited by examiner

*Primary Examiner* — Matthew L Reames
(74) *Attorney, Agent, or Firm* — Morgan Lewis & Bockius LLP

(57) ABSTRACT

A printed circuit board includes a wiring board including a plurality of insulating layers, a plurality of wiring layers, and a plurality of via layers, a first die embedded in the plurality of insulating layers, a bridge embedded on the first die in the plurality of insulating layers, a second die mounted on the wiring board, and a third die mounted on the wiring board.

20 Claims, 7 Drawing Sheets

PRINTED CIRCUIT BOARD

CROSS-REFERENCE TO RELATED APPLICATION

This application claims the benefit under 35 USC 119 (a) of Korean Patent Application No. 10-2021-0170043 filed on Dec. 1, 2021 in the Korean Intellectual Property Office, the entire disclosure of which is incorporated herein by reference for all purposes.

TECHNICAL FIELD

The present disclosure relates to a printed circuit board having a bridge and the like for die-to-die connection, embedded therein.

BACKGROUND

As semiconductor specifications become relatively higher, the fab node is being miniaturized, while the size of the die is increasing. When the size of the die increases, costs further increase. To improve this, various package platforms are being used, such as a multi-chip package in which a block with a different fab node required for each area inside the die is designed as a separate die, to connect the dies, chiplets in which multiple dies are packaged by breaking a large die into multiple smaller dies that serve the same function, or a 3D stack in which the dies are vertically stacked up.

In recent package platforms, it has become important to reduce the size of the package and to connect the die to the die well, and also to reduce costs.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a printed circuit board having a bridge capable of die-to-die interconnection, embedded therein.

An aspect of the present disclosure is to provide a printed circuit board in which the size of a package may be reduced.

An aspect of the present disclosure is to provide a printed circuit board in which costs may be reduced.

An aspect of the present disclosure is to provide a printed circuit board, in which a die is embedded together with a bridge in an organic substrate to reduce the size of the board and a package provided thereby, and to facilitate a die-to-die connection.

According to an aspect of the present disclosure, a printed circuit board includes a wiring board including a plurality of insulating layers, a plurality of wiring layers, and a plurality of via layers, at least one of the plurality of insulating layers including an organic insulating material; a first die embedded in the plurality of insulating layers; a bridge embedded on the first die in the plurality of insulating layers; a second die mounted on the wiring board; and a third die mounted on the wiring board.

According to an aspect of the present disclosure, a printed circuit board includes a wiring board including a plurality of insulating layers, a plurality of wiring layers, and a plurality of via layers; a first die embedded in the plurality of insulating layers; a bridge embedded on the first die in the plurality of insulating layers; a second die mounted on the wiring board; and a third die mounted on the wiring board. The first die has a thickness lower than a thickness of at least one of the second and third dies.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
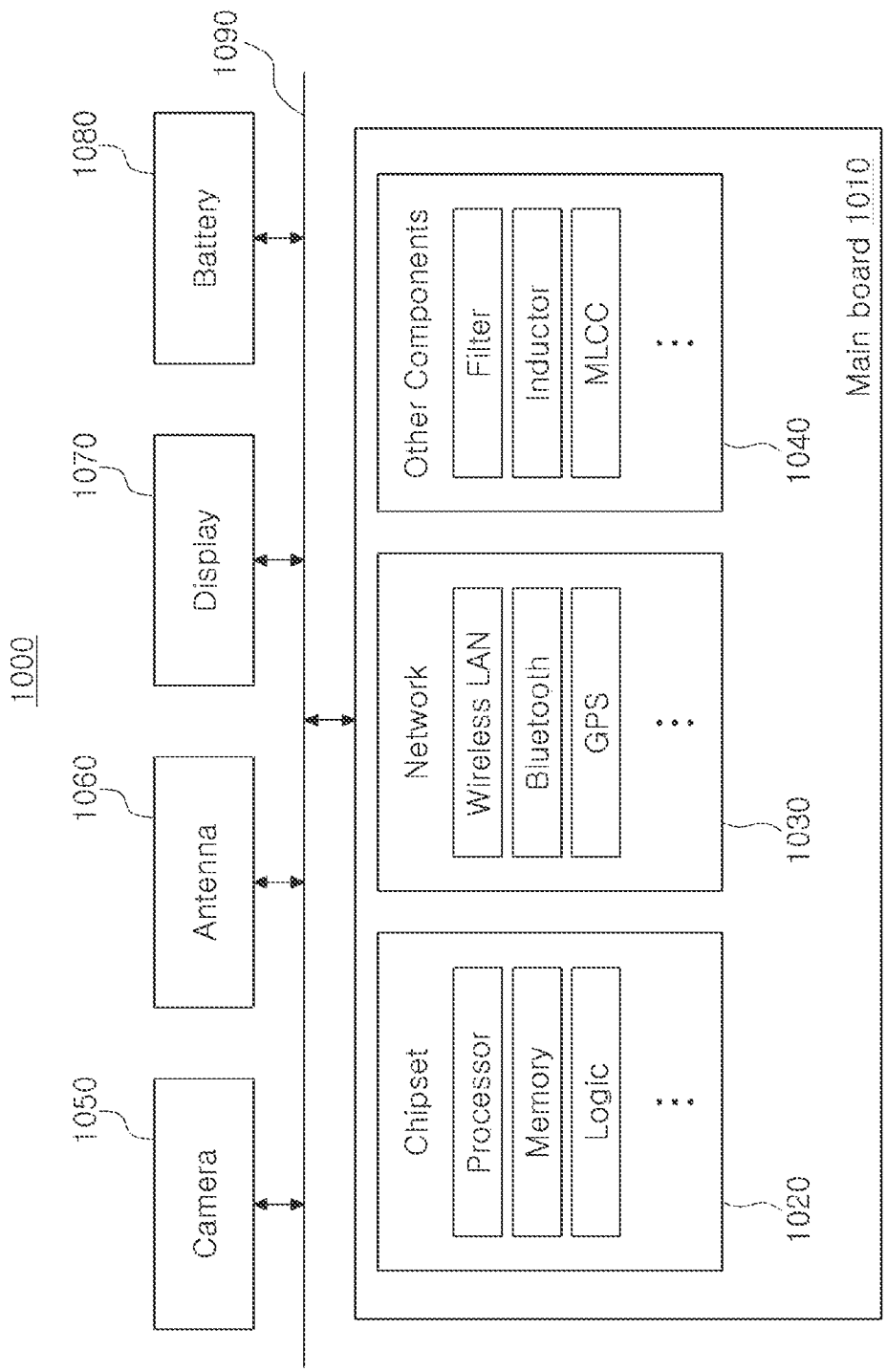
FIG. 1 is a block diagram schematically illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided and thus, this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least an embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other manners (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the detailed shapes illustrated in the drawings, but include changes in shape occurring during manufacturing.

The features of the examples described herein may be combined in various manners as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative sizes, proportions, and depiction of elements in the drawings may be exaggerated for clarity, illustration, and convenience.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; and a logic chip such as a central processor (for example, a central processing unit (CPU)), a graphics processor (for example, a graphics processing unit (GPU)), a digital signal processor, a cryptographic processor, a microprocessor, a microcontroller, an application processor, an analog-to-digital converter, an application-specific integrated circuit (ASIC), or the like. However, the chip related components 1020 are not limited thereto, but may also include other types of chip related components. In addition, the chip related components 1020 may be combined with each other. The chip-related component 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other electronic components that may or may not be physically or electrically connected to the mainboard 1010. These other electronic components may include, for example, a camera module 1050, an antenna module 1060, a display device 1070, a battery 1080, and the like, but are not limited thereto. For example, other electronic components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, these other components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device used for processing data.

Figure 2:
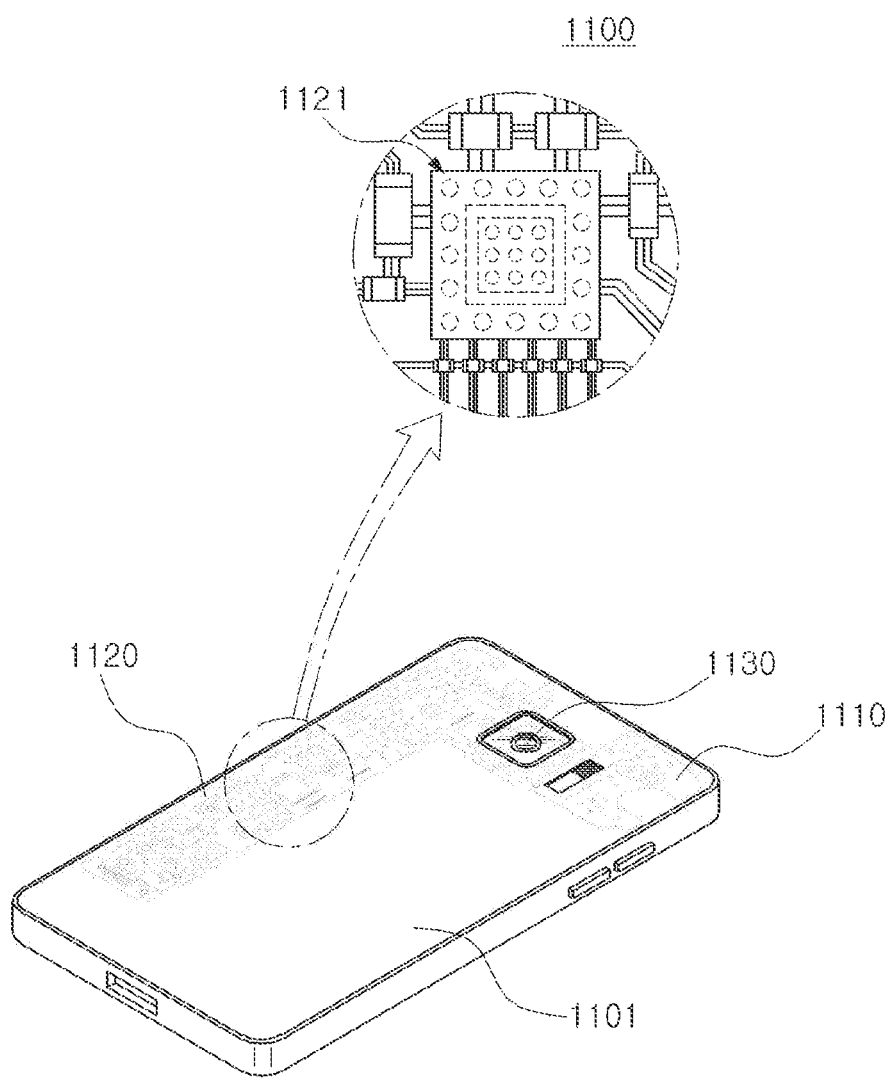
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated in the smartphone 1100, and various components 1120 are physically and/or electrically connected to the motherboard 1110. In addition, other components that may or may not be physically or electrically connected to the motherboard 1110, such as a camera module 1130 and/or a speaker 1140, may be accommodated in the electronic device. Some of the components 1120 may be the chip related components described above, for example, a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. On the other hand, the electronic device is not necessarily limited to the smartphone 1100, and may be another electronic device as described above.

Semiconductor Package Including Organic Interposer

In general, a semiconductor chip has many micro-electric circuits integrated therein, but it cannot function as a finished semiconductor product by itself, and there is a possibility of being damaged by an external physical or chemical shock. Therefore, the semiconductor chip itself is not used as it is, but the semiconductor chip is packaged and used in electronic devices as a package.

The reason semiconductor packaging is necessary is because there is a difference in the circuit width between the semiconductor chip and the mainboard of the electronic device from the viewpoint of electrical connection. In detail, in the case of a semiconductor chip, the size of the connection pad and the interval between the connection pads are very fine, whereas in the case of a mainboard used for electronic devices, the size of the component mounting pad and the interval between the component mounting pads are much larger than the scale of the semiconductor chip. Therefore, it is difficult to directly mount the semiconductor chip on such a mainboard, and a packaging technology capable of buffering a circuit width difference between each other is required.

Hereinafter, a semiconductor package including an organic interposer manufactured by such a packaging technology will be described in more detail with reference to the drawings.

Figure 3:
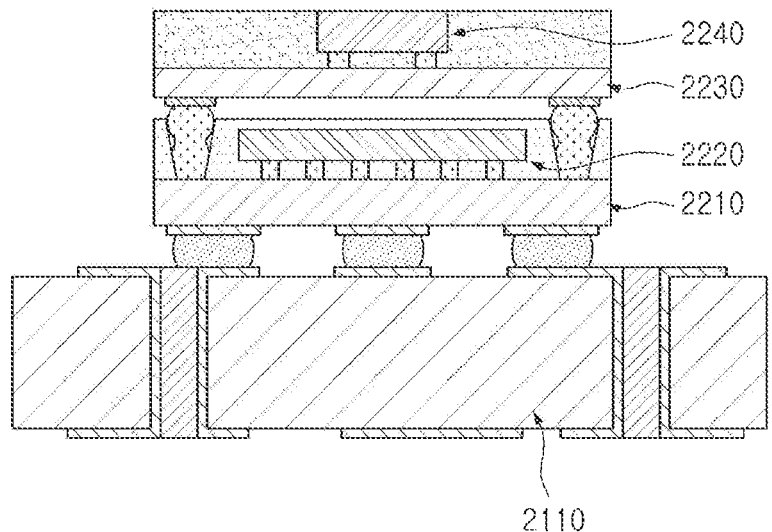
FIG. 3 is a cross-sectional view schematically illustrating a case in which a BGA package is mounted on a mainboard of an electronic device.

FIG. 3 is a cross-sectional view schematically illustrating a case in which a BGA package is mounted on a mainboard of an electronic device.

Among semiconductor chips, application specific integrated circuits (ASICs), such as graphics processing units (GPUs), have a very high price for each chip, and thus, it is very important to perform packaging with a high yield. Therefore, before the semiconductor chip is mounted, a ball grid array (BGA) substrate 2210 capable of rewiring thousands to hundreds of thousands of connection pads is first prepared, and expensive components such as a GPU 2220 are prepared. The same semiconductor chip is subsequently mounted and packaged on the BGA substrate 2210 using a surface mounting technology (SMT) or the like, and then finally mounted on the mainboard 2110.

On the other hand, in the case of the GPU 2220, it is necessary to significantly reduce a signal path with a memory such as a high bandwidth memory (HBM), and to this end, a semiconductor chip such as an HBM 2240 is mounted on an interposer 2230 and is packaged, to then be stacked on the package on which the GPU 2220 is mounted in the form of a package on package (POP) and used. However, in this case, there is a problem in that the thickness of the device becomes too thick, and there is a limit in minimizing the signal path as well.

Figure 4:
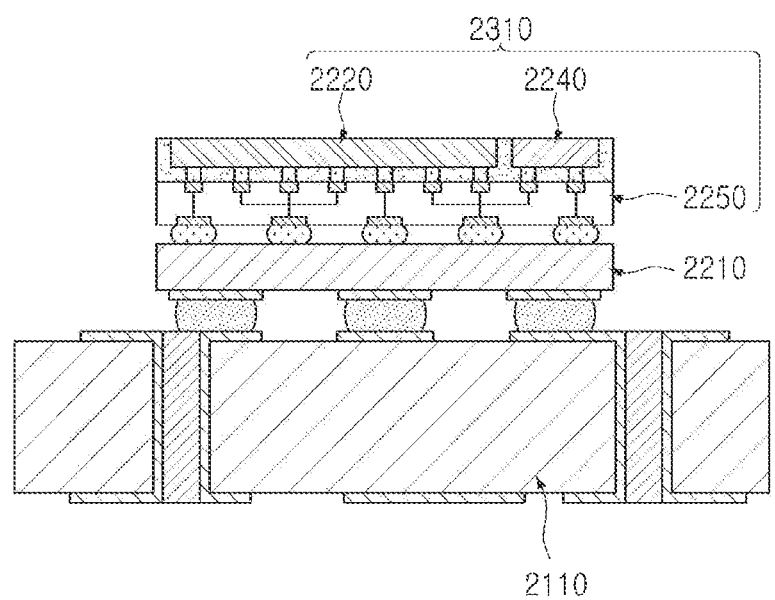
FIG. 4 is a cross-sectional view schematically illustrating a case in which a silicon interposer package is mounted on a mainboard.

FIG. 4 is a cross-sectional view schematically illustrating a case in which a silicon interposer package is mounted on a mainboard.

As a method for preventing the above-described problem, manufacturing a semiconductor package 2310 including the organic interposer may be considered using an interposer technology in which a first semiconductor chip such as the GPU 2220 and a second semiconductor chip such as the HBM 2240 are surface-mounted side by side on a silicon interposer 2250 and then packaged. In this case, the GPU 2220 and the HBM 2240 having thousands to hundreds of thousands of connection pads may be redistributed through the interposer 2250, and may be electrically connected through a minimum path. In addition, when the semiconductor package 2310 including the organic interposer is re-mounted on the BGA substrate 2210 or the like and redistributed, the semiconductor package 2310 may be finally mounted on the mainboard 2110. However, in the case of the silicon interposer 2250, it is very difficult to form a through-silicon via (TSV) and the like, and the manufacturing cost is also considerable, which is disadvantageous in terms of large area and low costs.

Figure 5:
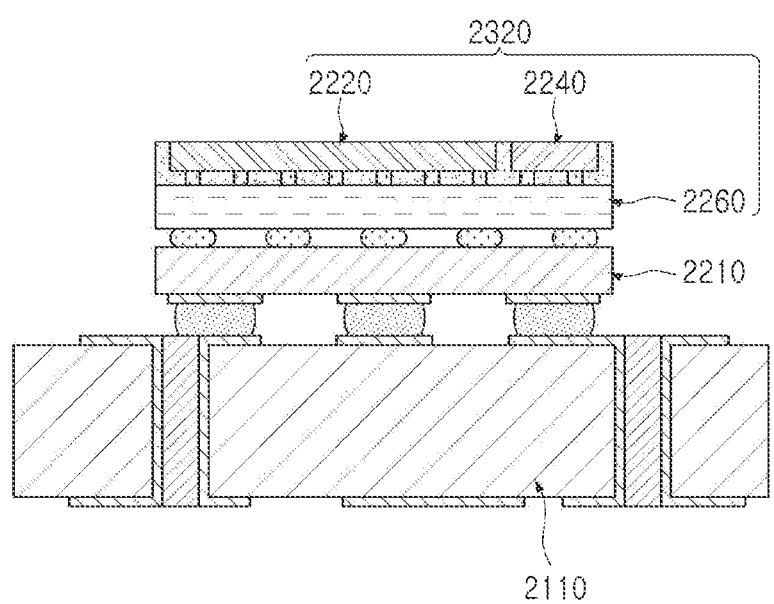
FIG. 5 is a cross-sectional view schematically illustrating a case in which an organic interposer package is mounted on a mainboard.

FIG. 5 is a cross-sectional view schematically illustrating a case in which an organic interposer package is mounted on a mainboard.

As a method for preventing the above-described problem, it may be considered to use an organic interposer 2260 instead of the silicon interposer 2250. For example, on the organic interposer 2260, a first semiconductor chip such as the GPU 2220 and a second semiconductor chip such as the HBM 2240 may be surface mounted side by side and then packaged, using an interposer technology, thereby manufacturing a semiconductor package 2320. In this case, the GPU 2220 and the HBM 2240 having thousands to hundreds of thousands of connection pads may be redistributed through the interposer 2260, and may be electrically connected through a minimum path. In addition, when the semiconductor package 2310 including the organic interposer is re-mounted on the BGA substrate 2210 or the like and redistributed, the semiconductor package 2310 may be finally mounted on the mainboard 2110. In addition, it may be advantageous for increasing the area and reducing costs.

On the other hand, in the case of the semiconductor package 2320 including the organic interposer, the semiconductor chips 2220 and 2240 are mounted on the interposer 2260, and then, a package process of molding the same is performed, thereby manufacturing the semiconductor package 2320. This is because, if the molding process is not performed, handling is not performed, and the connection to the BGA substrate 2210 may not be performed. Therefore, the rigidity is maintained through molding. However, in the case of performing the molding process, as described above, problems such as warpage, deterioration of fillability of an underfill resin, and cracks between the die and the molding material may occur due to the mismatch of the coefficient of thermal expansion (CTE) of the interposer 2260 and the semiconductor chips 2220 and 2240 with the molding material, or the like.

Printed Circuit Board Having Bridge and Die Embedded Therein

Hereinafter, a printed circuit board having a new structure in which a bridge capable of interconnecting dies and a die are embedded in a wiring board will be described with reference to the drawings.

When the printed circuit board described below is used as a BGA board of a semiconductor package, the above-described separate interposer may be omitted if necessary.

Figure 6:
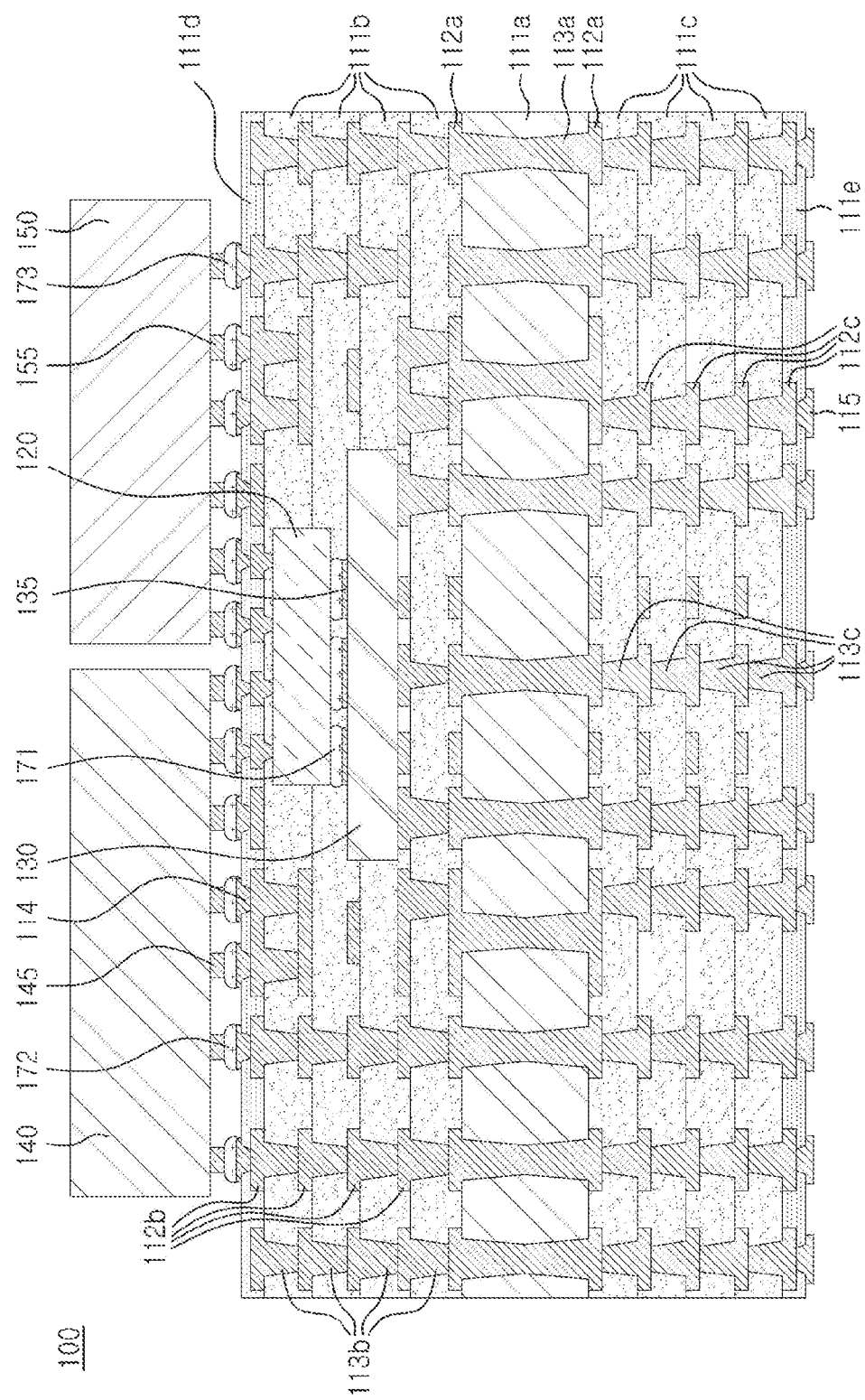
FIG. 6 is a cross-sectional view schematically illustrating a printed circuit board according to an example.

FIG. 6 is a cross-sectional view schematically illustrating a printed circuit board according to an example.

Figure 7:
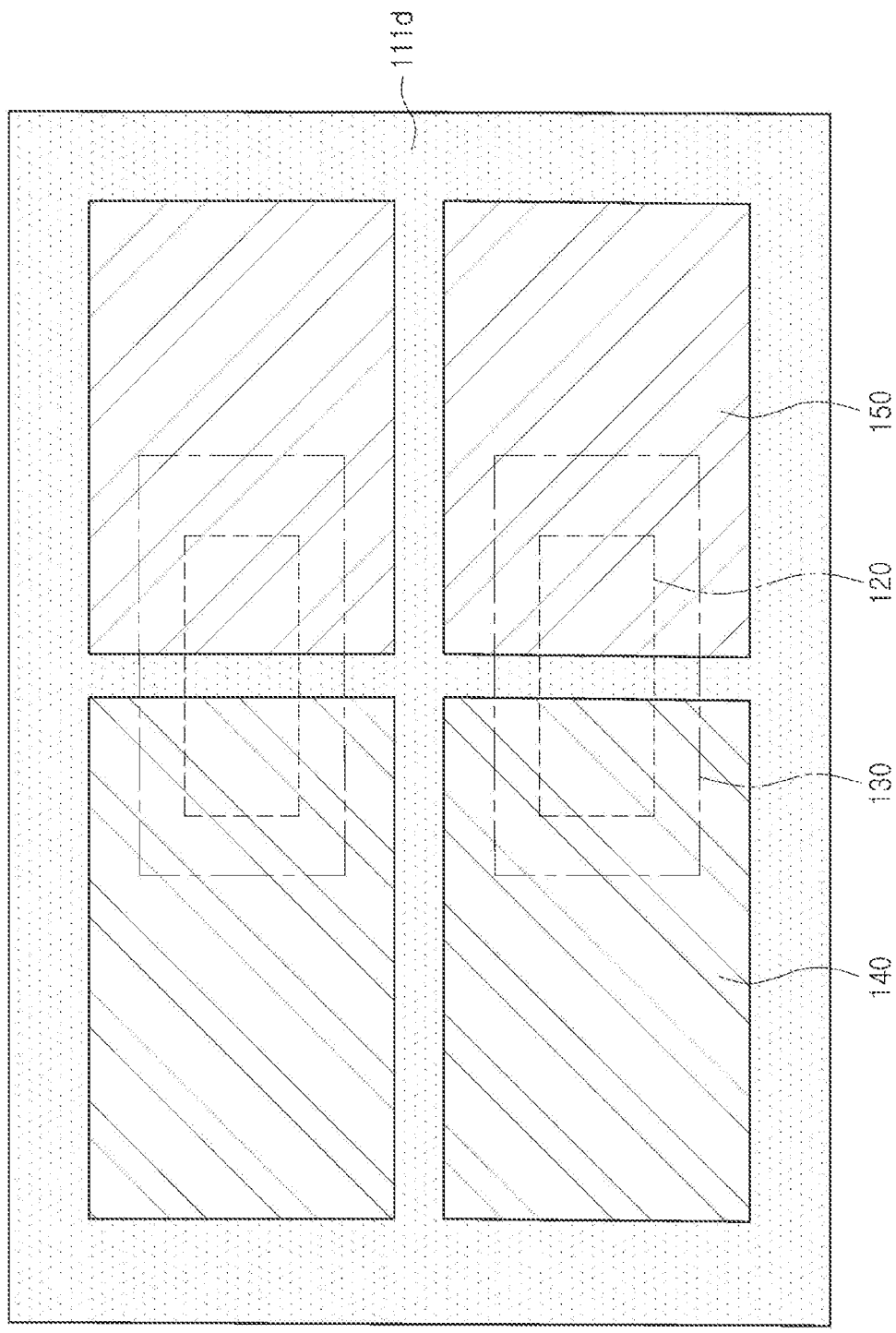
FIG. 7 is a plan view schematically illustrating a top-view of a printed circuit board according to an example.

FIG. 7 is a plan view schematically illustrating a top-view of a printed circuit board according to an example.

Referring to the drawings, a printed circuit board 100 according to an example includes a wiring board 110 including a plurality of insulating layers 111a, 111b, 111c, 111d and 111e, a plurality of wiring layers 112a, 112b and 112c, and a plurality of via layers 113a, 113b and 113c, a first die 130 embedded in the plurality of insulating layers 111a, 111b, 111c, 111d and 111e, a bridge 120 embedded on the first die 130 in the plurality of insulating layers 111a, 111b, 111c, 111d, and 111e, a second die 140 mounted on the wiring board 110, and a third die 150 mounted on the wiring board. For example, the printed circuit board 100 according to an example may have a package structure.

As described above, the printed circuit board 100 according to an example includes the bridge 120, and thus, the mounted die-to-die interconnection may be more effectively implemented. In addition, since the first die 130 is also embedded in the wiring board 110 together with the bridge 120, the overall size of the printed circuit board 100 may be reduced. For example, by separating the first die 130 from the second die 140 and stacking the separated first die 130 together with the bridge 120 in a stacking direction to be embedded, the size of the die disposed on the wiring board 110 may be reduced, and, as a result, the size of the printed circuit board 100 may be reduced. In addition, costs may also be reduced.

In the present disclosure, the stacking direction may refer to a direction in which respective components are stacked in a cross-sectional view, for example, a direction in which the plurality of insulating layers 111a, 111b, 111c, 111d and 111e are stacked, and may also refer to the thickness direction from another point of view.

On the other hand, the first to third dies 130, 140, and 150 may be electrically connected to the bridge 120, respectively. For example, the first to third dies 130, 140, and 150 may be electrically connected to one or more circuit layers of the bridge 120, which will be described later. Therefore, the first to third dies 130, 140, and 150 may be interconnected with each other through the bridge 120. From this point of view, the first die 130 may be disposed face-up such that a connection pad 135 faces the bridge 120. In addition, the first to third dies 130, 140 and 150 and the bridge 120 may be disposed such that at least respective portions thereof overlap each other thereof on a plane. Accordingly, the first to third dies 130, 140 and 150 and the bridge 120 may be electrically connected to each other through a minimum path.

In the present disclosure, the meaning on a cross-section may refer to a cross-sectional shape when the object is vertically cut or a cross-sectional shape when the object is viewed as a side-view. In addition, the meaning on a plane may be a shape when the object is horizontally cut, or a planar shape when the object is viewed in a top-view or a bottom-view.

On the other hand, at least one of the plurality of insulating layers 111a, 111b, 111c, 111d, and 111e may include an organic insulating material. In detail, at least build-up insulating layers 111b and 111c may each include an organic insulating material, and in more detail, the core insulating layer 111a, the build-up insulating layers 111b and 111c, and the passivation layers 111d and 111e may each include an organic insulating material. For example, the wiring board 110 may be an organic substrate. Therefore, compared to the silicon substrate, it is possible to reduce the difficulty of the process, and it is possible to reduce costs. The organic insulating material may include an insulating resin and an inorganic filler, and if necessary, may further include a glass fiber (Glass Fiber, Glass Cloth, Glass Fabric) as a core material for warpage control, etc., but the present disclosure is not limited thereto.

Also, the first die 130 may be thinner than at least one of the second and third dies 140 and 150. For example, the first die 130 may be thinner than the third die 150. Alternatively, the first die 130 may be thinner than the second die 140, and may be thinner than the third die 150. As such, since the thickness of the first die 130 embedded in the wiring board 110 may be relatively thin, the wiring board 110 may be made thinner, and the difficulty of the embedding process and costs may be further reduced.

Also, the first and second dies 130 and 140 may include a logic die, and the third die 150 may include a memory die. For example, the first and second dies 130 and 140 may be provided by dividing one large-size logic die. In this case, instead of mounting the first die 130 on the wiring board 110, the first die may be stacked and embedded together with the bridge 120 in the wiring board 110. In addition, the third die 150 may be a stack die such as HBM in which a plurality of memory dies are stacked in a stacking direction, and may be mounted on the wiring board 110 rather than embedded in the wiring board 110. Accordingly, the size of the printed circuit board 100 may be reduced, and at the same time, the thickness of the wiring board 110 may be reduced, and costs may be reduced. For example, high-performance ASICs, System on Chips (SoCs), or the like may be manufactured in a relatively small size and costs may be reduced.

Also, the first to third dies 130, 140 and 150 and the bridge 120 may be connected to each other, as one set, and the set may be provided as a plurality of sets. In this case, in each set, the bridge 120 and the first die 130 may be stacked and embedded in the wiring board 110 respectively, and thus, the size of the printed circuit board 100 may be significantly reduced, compared with the case of mounting the first die on the wiring board 100 without embedding the first die 130.

Hereinafter, the components of the printed circuit board 100 according to an example will be described in more detail with reference to the drawings.

The wiring board 110 includes the plurality of insulating layers 111a, 111b, 111c, 111d, and 111e, the plurality of wiring layers 112a, 112b, and 112c, and the plurality of via layers 113a, 113b, and 113c. The wiring board 110 may have a core shape. For example, the wiring board 110 may include a core insulating layer 111a, first wiring layers 112a disposed on both surfaces of the core insulating layer 111a, a first via layer 113a penetrating through the core insulating layer 111a and electrically connecting the first wiring layers 112a on both sides, one or more first build-up insulating layers 111b built up on the core insulating layer 111a, one or more second wiring layers 112b respectively disposed on the first build-up insulating layers 111b, one or more second via layers 113b penetrating through the first build-up insulating layers 111b, respectively, one or more second build-up insulating layers 111c built up below the core insulating layer 111a, one or more third wiring layers 112c respectively disposed on the second build-up insulating layers 111c, one or more third via layers 113c penetrating through the second build-up insulating layers 111c, respectively, a first passivation layer 111d disposed on the first build-up insulating layer 111b, and a second passivation layer 111e disposed on the second build-up insulating layer 111c. However, the present disclosure is not limited thereto, and the wiring board 110 may be of a coreless type if necessary.

The core insulating layer 111a may function as a core layer of the wiring board 110 and may provide rigidity. The material of the core insulating layer 111a is not particularly limited. For example, an insulating material may be used. In this case, as the insulating material, a thermosetting resin such as an epoxy resin, a thermoplastic resin such as polyimide, or a resin in which these resins are mixed with an inorganic filler such as silica or impregnated into the core material such as glass fiber together with the inorganic filler, for example, prepreg, Ajinomoto build-up film (ABF), FR-4, bismaleimide triazine (BT), or the like may be used, but the insulating material is not limited thereto. The core insulating layer 111a may be introduced through a copper clad laminate (CCL). The core insulating layer 111a may have a higher modulus than the build-up insulating layers 111b and 111c, but the present disclosure is not limited thereto. The core insulating layer 111a may be thicker than each of the build-up insulating layers 111b and 111c.

The build-up insulating layers 111b and 111c may be introduced to both sides of the core insulating layer 111a for build-up. The material of the build-up insulating layers 111b and 111c is also not particularly limited. For example, an insulating material may be used, and as the insulating material, a thermosetting resin such as an epoxy resin, a thermoplastic resin such as polyimide, or a resin in which these resins are mixed with an inorganic filler such as silica or impregnated into the core material of the inorganic filler resin, for example, prepreg, ABF, FR-4, BT, or the like may be used, but the insulating material is not limited thereto. The build-up insulating layers 111b and 111c may be equally built up on both sides based on the core insulating layer 111a, and thus may have the same number of layers. The detailed number of layers is not particularly limited, and may be variously changed according to design.

The passivation layers 111d and 111e are disposed on outermost sides of both sides of the wiring board 110 to protect internal components of the wiring board 110. A plurality of openings exposing portions of the wiring layers 112b and 112c may be formed in the passivation layers 111d and 111e, respectively. The material of the passivation layers 111d and 111e is not particularly limited. For example, an insulating material may be used, and in this case, a solder resist may be used as the insulating material. However, the present disclosure is not limited thereto, and ABF or the like may be used.

The wiring layers 112a, 112b, and 112c may perform various functions in the wiring board 110 according to the design of the corresponding layers, and for example, may include a ground pattern, a power pattern, a signal pattern, and the like. In this case, the signal pattern may include various signals other than a ground pattern and a power pattern, for example, include a data signal and the like. Each of these patterns may include a line pattern, a plane pattern, and/or a pad pattern. A material for forming the wiring layers 112a, 112b, and 112c may be a conductive material, in detail, a metal, such as copper (Cu), aluminum (Al), silver (Ag), tin (Sn), gold (Au), nickel (Ni), lead (Pb), titanium (Ti), or alloys thereof. The wiring layers 112a, 112b, and 112c may each include an electroless plating layer (or chemical copper) and an electrolytic plating layer (or electrolytic copper).

The via layers 113a, 113b, and 113c may electrically connect the wiring layers 112a, 112b, and 112c formed in different layers, and as a result, an electrical path may be formed in the wiring board 110. The via layers 113a, 113b, and 113c may perform various functions in the wiring board 110 according to the design of the corresponding layer, and for example, may include a ground via, a power via, a signal via, and the like. Each of the via layers 113a, 113b, and 113c may include a plurality of connection vias. The connection via of each of the via layers 113a, 113b, and 113c may include a conductive material, in detail, a metal material, such as copper (Cu), aluminum (Al), silver (Ag), tin (Sn), gold (Au), nickel (Ni), lead (Pb), titanium (Ti) or alloys thereof. The connection vias may each include an electroless plating layer (or chemical copper) and an electrolytic plating layer (or electrolytic copper). The connection via of each of the via layers 113a, 113b, and 113c may be of a type filled with a conductive material, but is not limited thereto, and may be a conformal type in which a conductive material is disposed along a wall surface of a via hole. The connection vias of the first via layer 113a may respectively have an hourglass shape, a cylinder shape, or the like, and the respective connection vias of the second and third via layers 113b and 113c may have oppositely tapered shapes.

If necessary, bump layers 114 and 115 connected to the exposed wiring layers 112b and 112c may be disposed on the openings of the passivation layers 111d and 111e, respectively. The bump layers 114 and 115 may include a plurality of bumps, each of which is comprised of a pad and a via. Solder bonding may be facilitated through the bump layers 114 and 115. The bump layers 114 and 115 may include a conductive material, in detail, a metallic material, such as copper (Cu), aluminum (Al), silver (Ag), tin (Sn), gold (Au), nickel (Ni), lead (Pb), titanium (Ti), or alloys thereof. The bump layers 114 and 115 may each include an electroless plating layer (or chemical copper) and an electrolytic plating layer (or electrolytic copper).

The bridge 120 may provide die-to-die interconnection, and the like. The bridge 120 may be a silicon bridge, an organic bridge, or the like, as will be described later. Details thereof will be described later.

Each of the dies 130, 140, and 150 may be a semiconductor chip. Each semiconductor chip may include an integrated circuit (IC) in which hundreds to millions of devices are integrated in a single chip. In this case, the integrated circuit may be a logic die such as a central processor (e.g., CPU), a graphics processor (e.g., GPU), a field programmable gate array (FPGA), a digital signal processor, an encryption processor, a microprocessor, a microcontroller, an analog-to-digital converter, an application-specific IC (ASIC), or the like, but is not limited thereto. For example, the integrated circuit may be a memory die or the like, such as a volatile memory (e.g., DRAM), non-volatile memory (e.g., ROM), flash memory, and high bandwidth memory (HBM), and may be other types such as a Power Management IC (PMIC) if necessary.

Each of the dies 130, 140, and 150 may be formed based on an active wafer, and in this case, silicon (Si), germanium (Ge), gallium arsenide (GaAs) or the like may be used as a base material constituting each body. Various circuits may be formed in the body. A connection pad may be formed on each body, and the connection pad may include a conductive material such as aluminum (Al) or copper (Cu). Each of the dies 130, 140, and 150 may be a bare die. In this case, the connection pad 135 may be exposed on the first die 130 embedded in the substrate, and metal bumps 145 and 155 may be respectively disposed on the connection pads of the second and third dies 140 and 150 mounted on the substrate. If necessary, a metal bump may also be disposed on the connection pad 135 of the first die 130. Each of the dies 130, 140, and 150 may be a packaged die. In this case, in the case of the first die 130 embedded in the substrate, an additional redistribution layer is formed on the connection pad 135 such that an outermost redistribution layer may be exposed, and an additional redistribution layer is formed on the connection pads of the second and third dies 140 and 150 mounted on the substrate, and the metal bumps 145 and 155 are disposed on the redistribution layer, respectively. If necessary, a metal bump may also be disposed on the redistribution layer additionally formed on the connection pad 135 of the first die 130. If necessary, the first die 130 may have the connection pad 135 on the lower surface as well as the upper surface, but the configuration is not limited thereto.

The dies 130, 140, and 150 may be connected to the bridge 120 through connecting members 171, 172, and 173, and/or may be mounted on the wiring board 110. For example, the connection pad 135 of the first die 130 may be connected to the bridge 120 through the first connecting member 171. Also, the first metal bump 145 of the second die 140 may be connected to the wiring board 110, for example, the first bump layer 114 through the second connecting member 172. Also, the second metal bump 155 of the third die 150 may be connected to the wiring board 110, for example, the first bump layer 114 through the third connecting member 173. The connecting members 171, 172, and 173 are each formed of a low-melting-point metal, for example, solder such as tin (Sn)-aluminum (Al)-copper (Cu), tin (Sn)-silver (Ag), or the like, but this is only an example and the material is not particularly limited thereto. The connecting members 171, 172, and 173 may be formed of a multi-layer or a single layer, respectively, and for example, when formed as a multi-layer, the connecting members 171, 172, and 173 may include a copper pillar and solder, and when formed as a single-layer, the connecting members 171, 172, and 173 may include only solder, but is not limited thereto.

Figure 8:
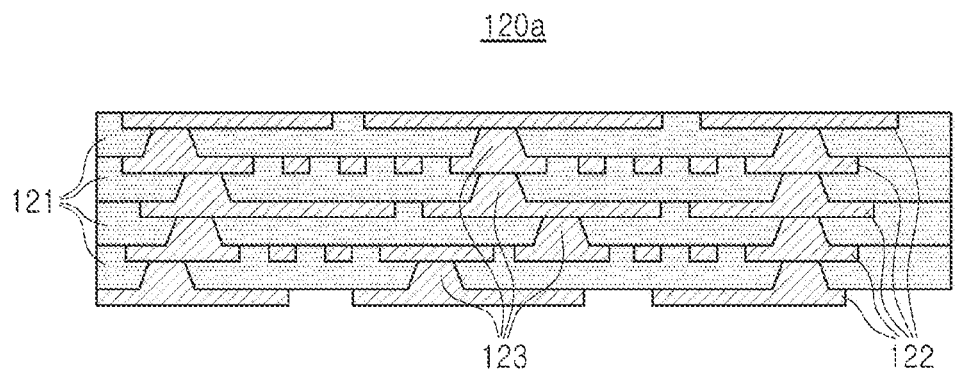
FIG. 8 is a cross-sectional view schematically illustrating a bridge according to an example.

FIG. 8 is a cross-sectional view schematically illustrating a bridge according to an example.

Referring to the drawing, a bridge 120a according to an example may be an organic bridge and may be implemented as the bride 120 described above. For example, the bridge 120a may have a body including an organic insulating material. Therefore, even when the bridge 120a is disposed in the wiring board 110, a reliability problem due to a mismatch in the coefficient of thermal expansion may hardly occur. In addition, the difficulty of the process for forming the bridge 120a and costs may be reduced. For the formation of the microcircuit, a photoimageable dielectric material (PID) may be used as the organic insulating material, but is not limited thereto.

The bridge 120a according to an example may include one or more insulating layers 121, one or more circuit layers 122, and one or more via layers 123. The one or more circuit layers 122 may have a higher density than the plurality of wiring layers 112a, 112b, and 112c. For example, the one or more circuit layers 122 may be high-density circuits having a smaller line/space (L/S) and/or thickness than the plurality of wiring layers 112a, 112b, and 112c, thereby being more effective for die-to-die interconnection. In this regard, the one or more via layers 123 may be formed to have a finer pitch than the plurality of via layers 113a, 113b, and 113c, thereby being easier to design with high density.

The insulating layer 121 may provide a body of the bridge 120a. The insulating layer 121 may include an insulating material, and in this case, the insulating material may be a photoimageable dielectric material (PID). When a photoimageable dielectric material (PID) is used as the material of the insulating layer 121, the thickness of the insulating layer 121 may be significantly reduced and photo-via holes may be formed, such that the circuit layer 122 and the via layer 123 may be easily designed with high density. However, the material is not limited thereto, and other organic insulating materials may be used. The number of layers of the insulating layer 121 is not particularly limited, and may be variously changed according to design. Boundaries of the insulating layers 121 may be distinctive or may be uncertain.

The circuit layer 122 may provide a die-to-die interconnection path. The circuit layer 122 may perform various functions according to the design of the corresponding layer, and may include at least a signal pattern. The circuit layer 122 may include a conductive material, in detail, a metallic material, such as copper (Cu), aluminum (Al), silver (Ag), tin (Sn), gold (Au), nickel (Ni), lead (Pb), titanium (Ti), or alloys thereof. The circuit layers 122 may each include an electroless plating layer (or chemical copper) and an electrolytic plating layer (or electrolytic copper). The number of circuit layers 122 is also not particularly limited, and may be variously changed according to design. An uppermost circuit layer 122 of the circuit layers 122 may be connected to the second wiring layer 112b through the second via layer 113b of the above-described wiring board 100. A lowermost circuit layer 122 of the circuit layers 122 may be connected to the aforementioned first die 130 through the aforementioned first connecting member 171.

The via layer 123 may electrically connect the circuit layers 122 formed in different layers, and as a result, an electrical path may be provided in the bridge 120a. The via layer 123 may perform various functions according to the design of the corresponding layer, and may include at least a signal via. Each of the via layers 123 may include a plurality of connection vias. The connection vias of each of the via layers 123 may include a conductive material, in detail, a metallic material, such as copper (Cu), aluminum (Al), silver (Ag), tin alloys thereof. The connection vias may each include an electroless plating layer (or chemical copper) and an electrolytic plating layer (or electrolytic copper). The connection via of each of the via layers 123 may be a type filled with a conductive material or a conformal type in which a conductive material is disposed along a wall surface of the via. Te respective connection vias of the via layers 123 may have a tapered shape in the same direction.

Figure 9:
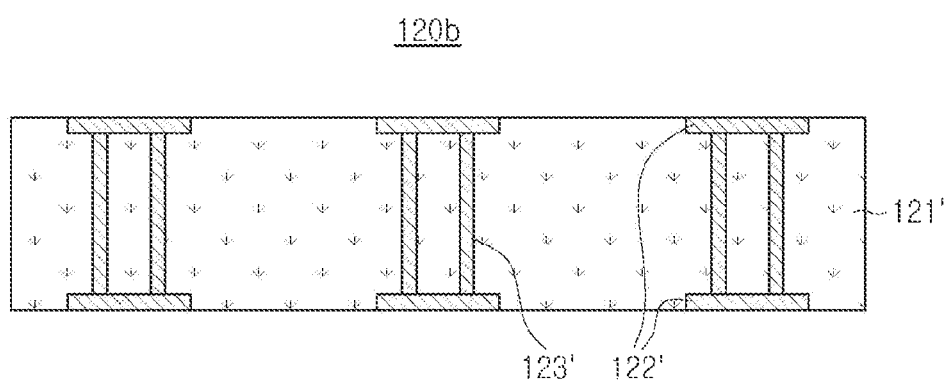
FIG. 9 is a cross-sectional view schematically illustrating a bridge according to another example.

FIG. 9 is a cross-sectional view schematically illustrating a bridge according to another example.

Referring to the drawing, a bridge 120b according to another example may be in the form of a semiconductor die and may be implemented as the bride 120 described above. For example, the bridge 120b may be a silicon bridge. For example, the bridge 120b may have a body including silicon, and a circuit may be formed by a semiconductor process. In this case, a finer circuit may be formed in the bridge 120b, which may be more advantageous for die-to-die interconnection.

The bridge 120b according to another example may include one or more insulating layers 121', one or more circuit layers 122', and one or more via layers 123'. The one or more circuit layers 122' may have a higher density than the plurality of wiring layers 112a, 112b, and 112c. For example, the one or more circuit layers 122' may be high-density circuits having a smaller line/space (L/S) and/or thickness than the plurality of wiring layers 112a, 112b, and 112c, thereby being more effective for die-to-die interconnection. In this regard, the one or more via layers 123' may be formed to have a finer pitch than the plurality of via layers 113a, 113b, and 113c, thereby being easier to design with high density.

The insulating layer 121' may provide the body of the bridge 120b, and may include an insulating material, and the insulating material may be silicon, in more detail, silicon dioxide. In this case, since the bridge 120b may be formed by a semiconductor wafer process, the circuit layer 122' and the via layer 123' may be easily designed with high density. However, the material is not particularly limited, and other semiconductor materials may be used. The number of layers of the insulating layer 121' is not particularly limited, and may be variously changed according to design. Boundaries between the insulating layers 121' may be distinct or may be uncertain.

The circuit layer 122' may provide a die-to-die interconnection path. The circuit layer 122' may perform various functions according to the design of the corresponding layer, and may include at least a signal pattern. The circuit layer 122' may include a conductive material, in detail, a metallic material, such as copper (Cu), aluminum (Al), silver (Ag), tin (Sn), gold (Au), nickel (Ni), lead (Pb), titanium (Ti), or alloys thereof. The circuit layer 122' may be formed by a deposition process such as chemical vapor deposition (CVD), but is not limited thereto. The number of the circuit layers 122' is also not particularly limited and may be changed according to design. An uppermost circuit layer 122' of the circuit layers 122' may be connected to the second wiring layer 112b through the second via layer 113b of the above-described wiring board 100. A lowermost circuit layer 122' of the circuit layers 122' may be connected to the aforementioned first die 130 through the aforementioned first connecting member 171.

The via layer 123' may electrically connect the circuit layers 122' formed in different layers, and as a result, an electrical path may be provided in the bridge 120b. The via layer 123' may perform various functions according to a design of the corresponding layer, and may include at least a signal via. Each of the via layers 123' may include a plurality of connection vias. The connection vias of each of the via layers 123' may have a conductive material, in detail, a metallic material, such as copper (Cu), aluminum (Al), silver (Ag), tin (Sn), gold (Au), nickel (Ni), lead (Pb), titanium (Ti), or alloys thereof. The connection via of each of the via layers 123' may be a through silicon via (TSV), but is not limited thereto.

As set forth above, according to an embodiment, a printed circuit board having a bridge capable of die-to-die interconnection, embedded therein, may be provided.

A printed circuit board in which the size of a package may be reduced is provided.

A printed circuit board in which costs may be reduced is provided.

In the present disclosure, the lower side, the lower portion, the lower surface, and the like are used to indicate the direction toward the mounting surface of the semiconductor package including the organic interposer, based on the cross section of the drawing for convenience, and the upper side, the upper portion, the upper surface, and the like are used in the direction opposite thereto. However, the direction is defined for convenience of description, and the scope of the claims is not particularly limited by the description of this direction.

While this disclosure includes detailed examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a wiring board including a plurality of first insulating layers, a plurality of wiring layers, and a plurality of first via layers, at least one of the plurality of first insulating layers including an organic insulating material;
   a first die embedded in the plurality of first insulating layers;
   a first bridge embedded on the first die in the plurality of first insulating layers and including a plurality of second insulating layers, one or more first circuit layers disposed on or within the plurality of second insulating layers, and one or more second vias connected to the one or more first circuit layers;
   a second die mounted on the wiring board; and
   a third die mounted on the wiring board,
   wherein the first die is face-up disposed in such a manner that a connection pad of the first die faces the first bridge and is connected to one of the one or more first circuit layers of the first bridge through a connecting member disposed between the first bridge and the first die.

2. The printed circuit board of claim 1, wherein the first die and the first bridge are stacked in a stacking direction along which the plurality of first insulating layers are stacked.

3. The printed circuit board of claim 1, wherein the first to third dies are respectively connected to the first bridge through at least one among the plurality of wiring layers and the plurality of first via layers.

4. The printed circuit board of claim 1, wherein the first, second, and third dies are interconnected in a die-to-die manner through the first bridge.

5. The printed circuit board of claim 3, wherein the first to third dies and the first bridge at least partially overlap each other respectively.

6. The printed circuit board of claim 1, wherein the organic insulating material comprises an insulating resin.

7. The printed circuit board of claim 6, wherein the at least one of the plurality of first insulating layers further comprises an inorganic filler dispersed in the insulating resin.

8. The printed circuit board of claim 7, wherein the at least one of the plurality of first insulating layers further comprises a glass fiber dispersed in the insulating resin.

9. The printed circuit board of claim 1, wherein the first and second dies each include a logic die, and
the third die comprises a memory die.

10. The printed circuit board of claim 9, wherein the third die includes a plurality of memory die stacked in a stacking direction along which the plurality of first insulating layers are stacked.

11. The printed circuit board of claim 1,
wherein the one or more first circuit layers have a smaller line/space (L/S) and/or a smaller thickness than the plurality of wiring layers.

12. The printed circuit board of claim 1, wherein the plurality of second insulating layers of the first bridge comprise an organic material.

13. The printed circuit board of claim 1, wherein the first bridge comprises a silicon bridge.

14. The printed circuit board of claim 1, further comprising:
a fourth die embedded in the plurality of first insulating layers;
a second bridge embedded on the fourth die in the plurality of first insulating layers and including a plurality of third insulating layers, one or more second circuit layers disposed on or within the plurality of third insulating layers, and one or more third vias connected to the one or more second circuit layers;
a fifth die mounted on the wiring board; and
a sixth die mounted on the wiring board,
where the fourth die is face-up disposed in such a manner that a connection pad of the fourth die faces the second bridge and is connected to one of the one or more second circuit layers of the second bridge through another connecting member disposed between the second bridge and the fourth die.

15. The printed circuit board of claim 1, wherein each of the first to third dies at least partially overlaps with the first bridge in a stacking direction along which the plurality of first insulating layers are stacked.

16. The printed circuit board of claim 1, wherein the second and third dies are disposed on one side of the first bridge opposite to another side of the first bridge on which the first die is disposed.

17. A printed circuit board comprising:
a wiring board including a plurality of first insulating layers, a plurality of wiring layers, and a plurality of via layers;
a first die embedded in the plurality of first insulating layers;
a bridge embedded on the first die in the plurality of first insulating layers and including a plurality of second insulating layers, one or more circuit layers disposed on or within the plurality of second insulating layers, and one or more vias connected to the one or more circuit layers;
a second die mounted on the wiring board; and
at least one third die mounted on the wiring board,
wherein the first die has a thickness lower than a thickness the second or a thickness of the at least one third die, and
wherein the first die is face-up disposed in such a manner that a connection pad of the first die faces the bridge and is connected to one of the one or more circuit layers of the bridge through a connecting member disposed between the bridge and the first die.

18. The printed circuit board of claim 17, wherein the first die and the bridge are stacked in a stacking direction along which the plurality of first insulating layers are stacked.

19. The printed circuit board of claim 17, wherein the first and second dies each include a logic die, and
the at least one third die comprises a memory die.

20. The printed circuit board of claim 17, wherein the at least one third die includes a plurality of memory dies stacked in a stacking direction along which the plurality of insulating layers are stacked.

* * * * *